United States Patent
Bollenbeck (10) Patent No.: US 11,519,984 B2
(45) Date of Patent: Dec. 6, 2022

(54) LOCAL-COIL APPARATUS FOR A MAGNETIC RESONANCE TOMOGRAPHY UNIT AND SYSTEMS AND METHODS THEREOF

(71) Applicant: Siemens Healthcare GmbH, Erlangen (DE)

(72) Inventor: Jan Bollenbeck, Eggolsheim (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/386,251

(22) Filed: Jul. 27, 2021

(65) Prior Publication Data
US 2022/0043085 A1 Feb. 10, 2022

(30) Foreign Application Priority Data

Aug. 10, 2020 (DE) ...................... 10 2020 210 089.6

(51) Int. Cl.
*G01R 33/36* (2006.01)
(52) U.S. Cl.
CPC ..... *G01R 33/3621* (2013.01); *G01R 33/3664* (2013.01); *G01R 33/3692* (2013.01)
(58) Field of Classification Search
CPC ............ G01R 33/3621; G01R 33/3664; G01R 33/3692
See application file for complete search history.

(56) References Cited

U.S. PATENT DOCUMENTS

| 6,043,659 A | 3/2000 | Mckinnon |
| 2007/0013376 A1 | 1/2007 | Heid et al. |
| 2008/0204027 A1* | 8/2008 | Luedeke ............ G01R 33/3692 324/322 |
| 2014/0062480 A1 | 3/2014 | Bollenbeck et al. |

(Continued)

FOREIGN PATENT DOCUMENTS

| CN | 110161440 A | 8/2019 |
| DE | 102005022551 B4 | 2/2010 |

(Continued)

OTHER PUBLICATIONS

German Office Action for German Application No. 10 2020 210 089.6 dated Jun. 7, 2021.

(Continued)

*Primary Examiner* — Gregory H Curran
(74) *Attorney, Agent, or Firm* — Lempia Summerfield Katz LLC (57) ABSTRACT

The disclosure relates to a method, a computer program, a data storage medium, a system, and a local-coil apparatus for a magnetic resonance tomography MRT unit having at least one receive coil configured to receive an MRT signal and a receive amplifier apparatus having at least one output amplifier unit and configured to amplify the received MRT signal in order to drive an analog-to-digital converter ADC. The at least one output amplifier unit is configured to amplify the MRT signal, below a signal-level threshold value, by a high gain, and, above the signal-level threshold value, by a low gain. The receive amplifier apparatus is configured to change a bias current of the at least one output amplifier unit according to a defined MRT signal level.

19 Claims, 2 Drawing Sheets

(56) References Cited

U.S. PATENT DOCUMENTS

2014/0218034 A1* 8/2014 Ishii .................. G01R 33/3692
 324/322
2016/0077174 A1 3/2016 Biber et al.
2018/0335490 A1* 11/2018 Zan .................... G01R 33/3621

FOREIGN PATENT DOCUMENTS

DE 102012215726 A1 3/2014
DE 102014218281 A1 3/2016

OTHER PUBLICATIONS

Infineon.com, Infineon BFP740, wideband NPN RF heterojunction bipolar transistor, Abb. 20: https://www.infineon.com/dgdl/Infineon-BFP740-DSv02_00-EN.pdf?fileId= 5546d46265f064ff0166389680a24ea4; Sep. 2018. pp. 1-21.
Jouda, Mazin, et al. "Automatic Adaptive Gain for Magnetic Resonance Sensitivity Enhancement." Analytical chemistry 91.3 (2019): 2376-2383.
nxp.com, NXP BFU530, NPN silicon RF transistor for high speed, Abb. 22: https://www.nxp.com/docs/en/data-sheet/BFU530W.pdf; Jan. 2014. pp. 1-22.

* cited by examiner

LOCAL-COIL APPARATUS FOR A MAGNETIC RESONANCE TOMOGRAPHY UNIT AND SYSTEMS AND METHODS THEREOF

The present patent document claims the benefit of German Patent Application No. 10 2020 210 089.6, filed Aug. 10, 2020, which is hereby incorporated by reference in its entirety.

TECHNICAL FIELD

The disclosure relates to a local-coil apparatus for a magnetic resonance tomography unit, a system including a magnetic resonance tomography unit, a local-coil apparatus, and a method for operating the local-coil apparatus. The disclosure also relates to a computer program which may be loaded directly into a memory of a computing device, and to an electronically readable data storage medium including electronically readable control data stored thereon for a computer program.

BACKGROUND

Magnetic resonance tomography (MRT) is a known imaging modality in medical technology. In this process, an object under examination, (e.g., a patient), is exposed to a magnetic field that is at least substantially static and on which is applied or superimposed a gradient, (e.g., a gradient field that increases linearly in space), which gradient is likewise at least substantially static. Then high-frequency or radiofrequency pulses, (e.g., an alternating magnetic field), are applied, which are used to excite nuclear spins to resonance in the object under examination. These excited nuclear spins may then be measured as an MRT signal by one or more receive coils, which act as antennas.

Local-coil apparatuses may be used for acquisitions at a high signal-to-noise ratio. These are in the form of antenna systems which may be mounted in the immediate vicinity of the object under examination. During an MRT measurement, the excited nuclei induce a voltage in a receive coil of the local-coil apparatus, which may then be amplified by cascaded amplification, (e.g., a low noise preamplifier (LNA) and at least one amplifier additionally connected thereafter), and passed to a signal processing unit of the magnetic resonance tomography unit. The variation over time of the received MRT signal exhibits the particular feature specific to the system that for most of the receive time, a signal level lies in a range close to the thermal noise floor. Only in a fraction of the receive time, close to the "center of k-space", where all the spin signals are in phase, does a far higher signal level arise.

A receive amplifier apparatus, which implements a switchover of the receive-path cascaded amplification in two or more stages, is provided in the local-coil apparatus in order to be able to accommodate the full signal dynamic range of the received MRT signal. This is accomplished by using a high gain for a certain part of k-space to be sampled, and a low gain for the central region of k-space.

One problem with a local-coil apparatus is that one or more amplifier stages must work with high linearity in the entire drive range up to the maximum expected MRT signal level in order to prevent signal distortions, which would manifest themselves as image artifacts. In order to satisfy the linearity requirements, the individual amplifier stages are operated at a suitably high bias current. This results in high power dissipation, however, which, besides high power consumption, leads to strong heating of the local-coil apparatus. This may be unpleasant in particular for a patient.

SUMMARY AND DESCRIPTION

The object of the present disclosure is to provide a local-coil apparatus having reduced power dissipation.

The scope of the present disclosure is defined solely by the appended claims and is not affected to any degree by the statements within this summary. The present embodiments may obviate one or more of the drawbacks or limitations in the related art.

The disclosure is based on the finding that it is necessary to design a bias current or operating point of each amplifier unit of a receive amplifier apparatus of the local-coil apparatus for a high linear drive capability, (e.g., to operate in a high-current mode), only close to the center of k-space, and that outside the center of k-space it is possible to operate in a low-current mode, in which each of the amplifier stages are configured for a minimum noise figure.

The disclosure provides a local-coil apparatus for a magnetic resonance tomography (MRT) unit having at least one receive coil configured to receive an MRT signal. The MRT unit further includes a receive amplifier apparatus having at least one output amplifier unit. The receive amplifier apparatus is configured to amplify the received MRT signal in order to drive an analog-to-digital converter (ADC). In other words, the local-coil apparatus of the magnetic resonance tomography unit has one or more receive coils, also known as local coils or coils, which act as antennas and may receive the signal from the excited nuclear spins as an MRT signal. This signal is amplified by a receive amplifier apparatus in order to drive an analog-to-digital converter. The receive amplifier apparatus may be in the form of a hardware-based amplifier apparatus including one or more amplifier units, e.g., as cascaded amplification. The receive amplifier apparatus has at least one output amplifier unit, which amplifies the MRT signal to an output of the receive amplifier apparatus such that it may be used as an input to the analog-to-digital converter.

The output amplifier unit is configured to amplify the MRT signal, below a signal-level threshold value, by a high gain, known as a high-gain stage, and, above the signal-level threshold value, by a low gain, known as a low-gain stage. The receive amplifier apparatus is moreover configured to change a bias current, or an operating point, of the at least one output amplifier unit according to a defined MRT signal level. This means that the output amplifier unit may have two amplification stages, one having a high gain and one having a low gain. A switchover of the gain may be performed at a signal-level threshold value, which signal-level threshold value is selected such that, outside the center of k-space, where the MRT signal level is low and lies in a range close to the thermal noise floor, for instance at −174 dBm/Hz, amplification is at the high gain, and close to the center of k-space, for instance at a signal level of −30 dBm (e.g., for 3 Tesla MRT systems), at the low gain.

In addition, the bias current and hence the operating point of the output amplifier unit is changed according to this MRT signal level in order to reduce power dissipation of the receive amplifier apparatus. The MRT signal level at which the output amplifier unit changes its bias current may be defined in particular according to the expected signal level.

The output amplifier unit may be a hardware-based amplifier, in particular an SGA (switchable gain amplifier), whose integrated circuit may include one or more bipolar transistors such as small-signal bipolar transistors. The fact that in modern small-signal bipolar transistors the lowest noise figure is achieved at small collector currents may be exploited here. The bias current of the output amplifier unit may be adjusted, for example, by control signals that control the output amplifier unit in order to adjust the bias current.

The disclosure has the advantage that power dissipation, which depends mainly on the bias current or operating point of the at least one output amplifier unit, may be reduced, while the receive amplifier apparatus may still meet the full signal-level dynamic range of the MRT signal for driving the ADC. By limiting the power dissipation, it is possible to reduce heating of the local-coil apparatus, which in particular is advantageous for patient comfort. In addition, power consumption of the local-coil apparatus may be reduced, which may facilitate wireless operation of the local-coil apparatus, (e.g., operation by a rechargeable battery or by wireless energy transmission).

In an advantageous embodiment, the receive amplifier apparatus is configured to operate the output amplifier unit below a first switchover signal-level threshold value of the MRT signal in a low-current mode and above the first switchover signal-level threshold value in a high-current mode, wherein the first switchover signal-level threshold value is smaller than the signal-level threshold value. In other words, before the switchover of the gain from the high gain to the low gain, the bias current of the output amplifier unit is changed from a low-current mode to a high-current mode at a first switchover signal-level threshold value. For example, the output amplifier unit may receive a control signal (e.g., bias switch) to switch over from the low-current mode into the high-current mode, or vice versa, at an MRT signal level equal to the first switchover signal-level threshold value. In the low-current mode (low bias), the output amplifier unit may have an operating point that has a low noise figure. In the high-current mode (high bias), the output amplifier unit may be configured for maximum linear drive capability. The first switchover signal-level threshold value may be defined for an MRT signal level at which the output amplifier unit is still operating in a sufficiently linear manner at the low gain. The first switchover signal-level threshold value may be smaller than the signal-level threshold value in order that the output amplifier unit may supply the same maximum output power both at high gain and at low gain. This embodiment has the advantage that the output amplifier unit, which may be in the form of an operational amplifier, may meet, in both amplifier stages, the full operating range of an analog-to-digital converter to be driven, and at the same time may minimize a power dissipation of the local-coil apparatus by virtue of operating in low-current mode.

The local-coil apparatus may have the ADC, wherein the signal-level threshold value is defined by a maximum input level value of the ADC at the high gain. This means that the analog-to-digital converter may be provided in the local-coil apparatus, and the signal-level threshold value at which the amplifier stage is switched is defined by the MRT signal level at which the maximum input level value of the ADC is reached with the high gain. In other words, when the input level value of the ADC reaches the maximum value before overdriving the ADC, the gain is switched from the high gain to the low gain. This may be achieved, for instance, by using a control signal (e.g., gain switch) to control the input amplifier unit.

It is also advantageous that the first switchover signal-level threshold value is defined by a value of the MRT signal level that is smaller than the signal-level threshold value by a gain value, wherein the gain value is the amplification ratio between high gain and low gain. For example, for an MRT signal level of −40 dBm, which may represent the signal-level threshold value, an amplification is reduced between high gain and low gain in a ratio of 12 dB. Consequently, the first switchover signal-level threshold value is specified at a signal level of −52 dBm. Switching the bias current from low-current mode into high-current mode at the first switchover signal-level threshold value is advantageous because the output amplifier unit may hence be operated up to the maximum input level value of the ADC both at low gain and at high gain. In other words, the output amplifier unit may be operated at low gain with a linear drive capability from the first switchover signal-level threshold value to the maximum input level value of the ADC, and likewise after switching over to the low gain. As a result of the linearity of an output level signal from the output amplifier unit, it is hence possible to output an output level that is the same at the switchover signal-level threshold value and at the signal-level threshold value.

In an advantageous development, the receive amplifier apparatus further includes an input amplifier unit in addition to the output amplifier unit, wherein the output amplifier unit is connected after the input amplifier unit. The input amplifier unit may advantageously be in the form of a low noise amplifier (LNA), which is configured to amplify the MRT signal before the output amplifier unit. This means that the receive amplifier apparatus is in the form of an amplifier chain including at least the input amplifier unit and the output amplifier unit connected thereafter. The receive amplifier apparatus may be configured to operate the input amplifier unit, below a second switchover signal-level threshold value, in an input amplifier low-current mode, and, above the second switchover signal-level threshold value, in an input amplifier high-current mode. This may be accomplished, for instance, by sending to the receive amplifier apparatus a control signal (e.g., bias switch of the input amplifier unit) when the second switchover signal-level threshold value is reached, which signal may switch over the bias current, and hence the operating point, of the input amplifier unit between input amplifier low-current mode and input amplifier high-current mode. This development has the advantage of being able to reduce additionally a current and hence a power dissipation.

The second switchover signal-level threshold value is advantageously the signal-level threshold value. In other words, the input amplifier unit is switched at the same time as the change of the high gain to the low gain. In this case, the input amplifier unit may be switched from the low-current mode to the high-current mode at a lower MRT signal level than the output amplifier unit, because the low noise amplifier may be configured for the full drive range. The advantage of the second switchover signal-level threshold value having the same value as the signal-level threshold value is that a magnitude and phase of the amplification of the signal by the receive amplifier apparatus for a particular operating-point setting and/or a gain change may need to be corrected in downstream digital signal processing. This may be performed by a measured correction factor. Merging the second switchover signal-level threshold value with the signal-level threshold value may thus reduce measurements for determining the correction factor, whereby measurement time and costs may be saved.

According to a further advantageous development, the local-coil apparatus has a wireless power supply, e.g., a rechargeable battery and/or an induction coil. The local-coil apparatus may thereby be arranged flexibly on the object under examination, e.g., on a patient. Because the power dissipation may be reduced by changing the bias current according to the MRT signal level, operating a local-coil apparatus using a rechargeable battery and/or a power supply provided by an induction coil is more efficient, or is only made possible at all in this way.

In a further advantageous development, the local-coil apparatus has a communication apparatus, which is configured to receive wirelessly one or more control signals for changing the gain and/or for changing the bias current. In particular, the respective control signals may be sent from the magnetic resonance tomography unit to the local-coil apparatus in order to switch over the gain and/or to switch over the bias current, with the control signals being received by the communication apparatus and provided for controlling the receive amplifier apparatus. Receiving control signals that may be generated in particular by the MRT unit is advantageous in particular because the MRT unit may specify which region of k-space is being measured and hence what MRT signal level is expected. A switchover when one of the threshold values is reached may thereby be performed quickly and reliably. The communication apparatus may be configured as a wireless local area network (WLAN) or a similar transmission standard, and may establish a bidirectional radio link to the MRT unit. In particular, a particular control signal may also be implemented by modulating a wirelessly transmitted reference signal, which defines a reference clock for sampling, digital signal processing and/or for synthesizers being used. Alternatively, a control signal may also be achieved by modulating a signal for wireless energy transmission.

Alternatively, or additionally, the communication apparatus includes an optical sensor configured to receive the control signal as an optical signal. For example, the receive amplifier apparatus may be controlled by a light signal, in particular, an infrared signal. Alternatively, or additionally, a control signal may also be achieved by modulating an in-bore light, for instance, by intensity modulation. The optical sensor may be in the form of a photodiode that may receive the optical signal.

A further aspect of the present disclosure is a system including a magnetic resonance tomography (MRT) unit and a local-coil apparatus or according to one of the above developments. The magnetic resonance tomography unit and/or the local-coil apparatus have a memory unit configured to provide to a digital signal processing unit of the MRT unit at least one correction parameter for correcting a magnitude and phase of the MRT signal resulting from the change to the gain and/or the change to the bias current. In other words, a memory unit, in particular a non-volatile memory, may be provided which may provide a correction parameter to a digital signal processing unit of the MRT unit. The correction parameter may be used to correct any change in magnitude or phase that may arise as a result of the change in gain and/or the associated bias current. The correction parameter may be determined using the local-coil apparatus in an earlier measurement, which may be carried out when the local-coil apparatus is commissioned for the first time. Alternatively, or additionally, the correction parameter may be determined and saved in the memory unit back during manufacture of the local-coil apparatus. This aspect has the advantage that a change in magnitude and/or phase with the switchover of the gain and bias current may be corrected.

A further aspect of the disclosure relates to a method for operating a local-coil apparatus, wherein a control signal controls at least one output amplifier unit of a receive amplifier apparatus in order to change a gain, and wherein a bias current of the output amplifier unit is changed by the control signal or one or more additional control signals, wherein respective control signals are generated according to a defined MRT signal level. This aspect provides the same advantages and variation options as for the local-coil apparatus. The local-coil apparatus and the associated advantages may each also be applied mutatis mutandis to the system and/or to performing the method disclosed herein. Thus the disclosure also includes those developments of the local-coil apparatus, the system, and the method that have embodiments which, to avoid unnecessary redundancy, are not described here explicitly in each combination.

A further aspect of the disclosure is a computer program, which implements on an electronic computing device a method as disclosed herein. The computer program may also be in the form of a computer program product, which may be loaded directly into a memory of a computing device. The computer program product has program code means in order to perform a method when the computer program product is executed in and/or by the computing device.

A further aspect of the disclosure relates to an electronically readable data storage medium. The electronically readable data storage medium includes electronically readable control data stored thereon, which control data includes at least one computer program or is configured such that it performs a method when the data storage medium is used in a computing device.

Further advantages, features, and details of the disclosure arise from the following description of embodiments and from the drawings.

BRIEF DESCRIPTION OF THE DRAWINGS

The present disclosure is now explained in more detail with reference to the accompanying drawings, in which.

DETAILED DESCRIPTION

The exemplary embodiments described in greater detail below constitute embodiments of the present disclosure. They shall not be considered restrictive, however.

Figure 1:
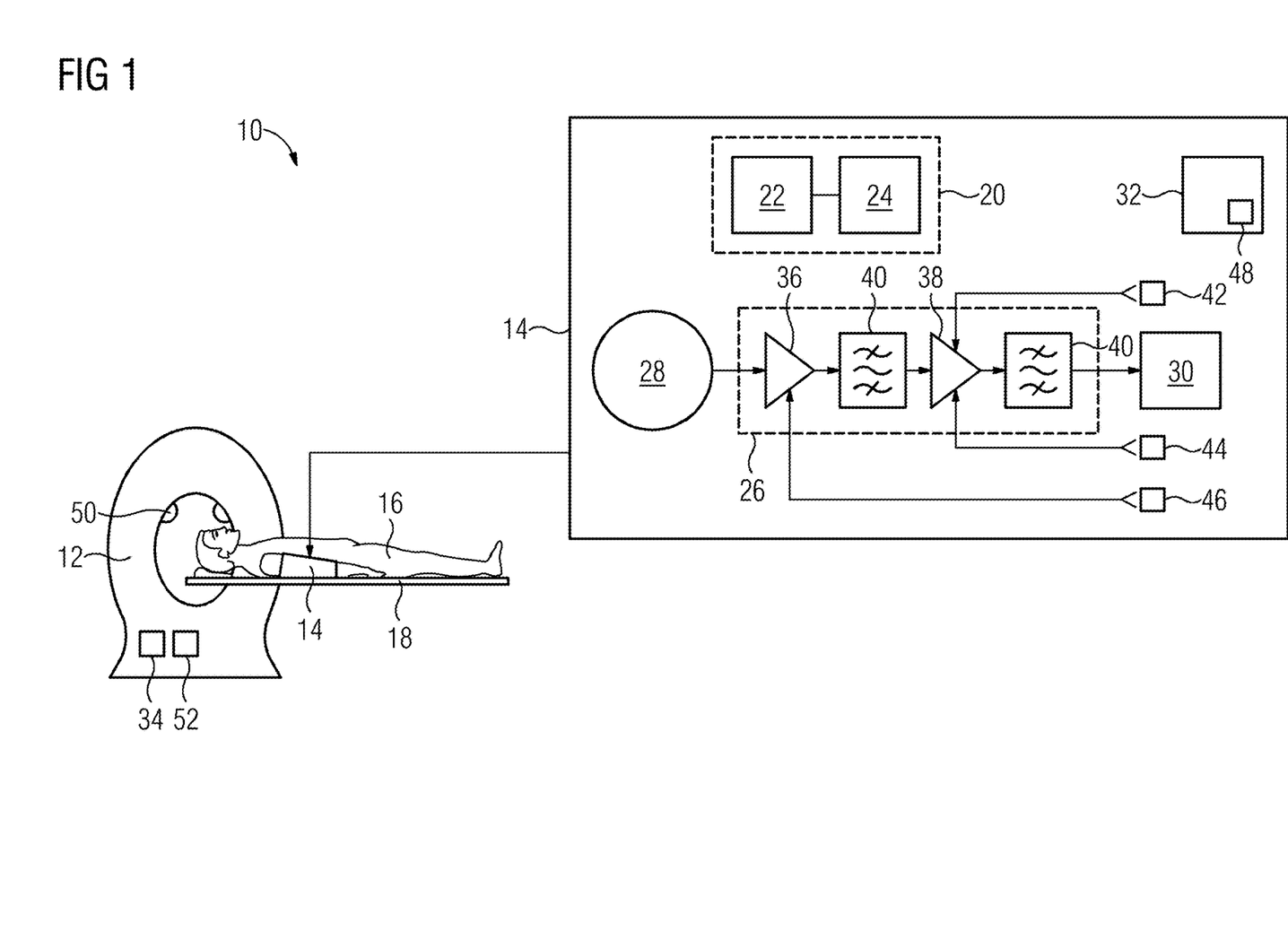
FIG. 1 depicts a schematic diagram of a system including a magnetic resonance tomography unit and a local-coil apparatus according to an embodiment.

FIG. 1 shows a system 10 including a magnetic resonance tomography (MRT) unit 12 and a local-coil apparatus 14 according to an exemplary embodiment. In this exemplary embodiment, the local-coil apparatus 14 may be arranged in an elbow region of a patient 16 who may be located on a patient table 18 of the magnetic resonance tomography unit 12 for an examination. In this case, the local-coil apparatus 14 may be in the form of a wireless local-coil apparatus. This means that there may be no signal supply cables or power supply cables taken to the magnetic resonance tomography unit 12 or the patient table 18. This has the advantage that the local-coil apparatus 14 may be arranged more flexibly adjacent to the patient 16.

The placement of the local-coil apparatus 14 in an elbow region shall be understood here merely as an example, and the local-coil apparatus 14 may also be arranged, for instance, in other anatomical regions of the body to be examined such as the head, knee, chest, heart, prostate, ankle, wrist, and shoulder. The magnetic resonance tomography unit 12 may have a main magnetic field of 1.5, 3, or 7 Tesla, for instance. In the following examples, in particular in the numerical examples, it is assumed that it is a 1.5 Tesla magnetic resonance tomography unit 12.

In order that the local-coil apparatus 14 may be operated as a wireless local-coil apparatus, the local-coil apparatus 14 has a wireless power supply 20, which may include an induction coil 22, which is configured to induce a voltage by electromagnetic induction that may be used to charge a rechargeable battery 24, for example. The energy stored in the rechargeable battery 24 may then be used to supply electrical power to the wireless local-coil apparatus 14, in particular, to a receive amplifier apparatus 26 of the local-coil apparatus 14.

The receive amplifier apparatus 26 is configured to amplify an MRT signal, which may be received by a receive coil 28, in order to drive an analog-to-digital converter 30. The MRT signal digitized by the analog-to-digital converter 30 may then be sent to the magnetic resonance tomography unit 12, (e.g., by a communication apparatus 32), which magnetic resonance tomography unit 12 has a computing device 34, for example, which is configured to process further the digitized MRT signal. The communication apparatus 32 may have a radio module, for instance, which is configured to send and/or receive signals wirelessly. The computing device 34 of the magnetic resonance tomography unit 12 may be in the form of a computer having a central processing unit (CPU).

In order to amplify the MRT signal, the receive amplifier apparatus 26 may have an input amplifier unit 36 and an output amplifier unit 38 connected thereafter. The input amplifier unit 36 may be in the form of a low noise amplifier (LNA), and the output amplifier unit 38 may be in the form a switchable gain amplifier (SGA). In addition to the input and output amplifier units 36, 38, the receive amplifier apparatus 26 may have respective bandpass filters 40 connected after each of the amplifier units 36, 38.

The variation over time of the received MRT signal exhibits the particular feature specific to the system that an MRT signal level has a low signal level for most of the receive time, and has a much higher signal level only in a fraction of the receive time, in which all the spin signals are in phase. In other words, the signal level is low in the edge regions of k-space, and high in the center of k-space, where k-space represents an array of measured raw data from the phase-encoded and frequency-encoded signals. The output amplifier unit 38 is configured to amplify the MRT signal using at least two amplification settings in order to reproduce this signal dynamic range, in particular to be able to drive the analog-to-digital converter 30 in the specified drive range. This may be accomplished by using a high gain (e.g., high-gain stage) in particular for a low MRT signal level, and a low gain (e.g., low-gain stage) at and above a sufficiently high MRT signal level.

In order to avoid any signal distortion, which would manifest itself in image artifacts, it was previously the case to operate the receive amplifier apparatus 26, (e.g., the input amplifier unit 36 and the output amplifier unit 38), at an operating point that works in a highly linear manner in the entire drive range up to a maximum expected MRT signal level. In order to be able to satisfy the linearity requirements, however, the individual amplifier units 36, 38 would have to be operated at a suitably high bias current. This has the disadvantage of resulting in high power dissipation, which would have a disadvantageous effect in particular on the wireless local-coil apparatus 14, because it would present a heavy load to the rechargeable battery 24, for instance. In addition, a high power dissipation would cause heating of the local-coil apparatus 14, which, in particular in the time-consuming measurements using the magnetic resonance tomography unit 12, would have a disadvantageous effect on patient comfort of the patient 16.

Figure 2:
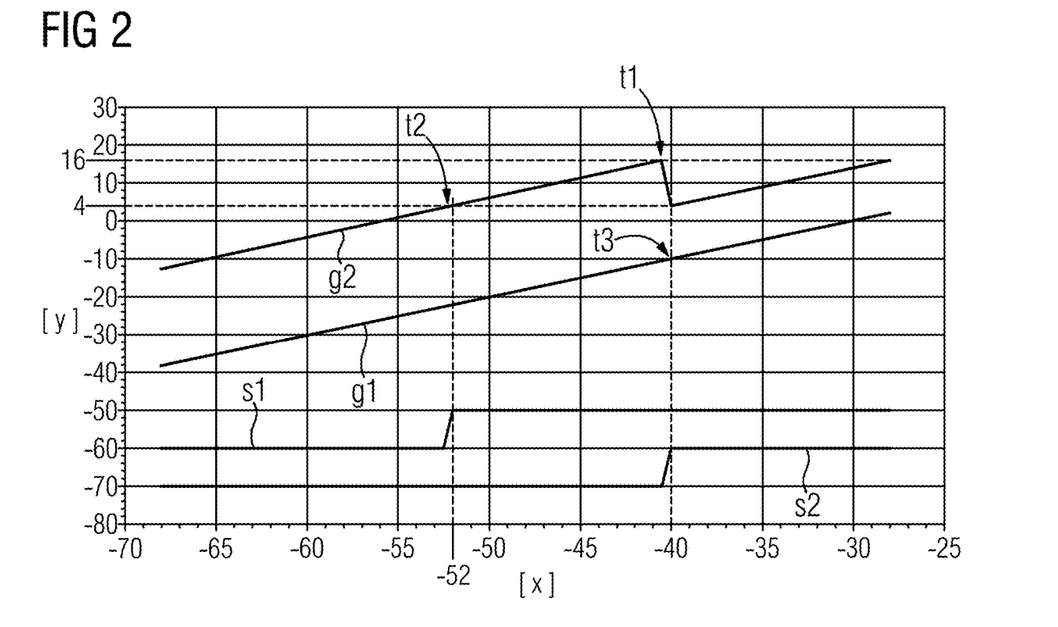
FIG. 2 depicts an example graph containing switching thresholds of a receive amplifier apparatus according to an embodiment.

In order to limit the disadvantageous effects of the high power dissipation, the receive amplifier apparatus 26 is configured to change a bias current of the input amplifier unit 36 and/or of the output amplifier unit 38 according to a defined MRT signal level. For the purposes of illustration, FIG. 2 shows an example graph containing input levels and output levels for each amplifier unit and switching thresholds. The x-axis represents an input level in dBm, and the y-axis represents an associated output level in dBm. The graph g1 shows an input level and output level for the input amplifier unit 36, and the graph g2 shows an input level and output level for the output amplifier unit 38. The graphs s1 and s2 in FIG. 2 are schematic representations of switching signals, which in this figure are depicted solely for better understanding and do not represent signal levels or currents. This means that the units and numerical examples on the x-axis and y-axis are not representative for s1 and s2. In this example, the output level of the output amplifier unit 38 (y-value of graph g2) is input to the analog-to-digital converter 30 of the local-coil apparatus 14.

The receive amplifier apparatus 26 is configured to amplify the output amplifier unit 38, below a signal-level threshold value t1, which in this example lies at −40 dBm, at the high gain (e.g., high-gain stage) and, above the signal-level threshold value t1, at a low gain (e.g., low-gain stage). The signal-level threshold value t1 may be defined in particular by a maximum input level value of the analog-to-digital converter 30, which in this example may lie at +16 dBm.

When, or shortly before, the signal-level threshold value t1 is reached, the output amplifier unit 38 may receive a control signal 42 (e.g., gain switch) to change the gain, in order that the output level of the output amplifier unit 38 is lowered by a gain value, which is a gain ratio between the high gain and the low gain. In this exemplary embodiment, the gain value may lower the signal level g2 of the output amplifier unit 38 at the signal-level threshold value t1 by 12 dB, from 16 dBm to 4 dBm, for example. The signal-level threshold value t1 is thus defined such that the analog-to-digital converter 30 is not overdriven during operation at high gain nor during operation at low gain. In addition, cascaded amplification by the input amplifier unit 36 and of the output amplifier unit 38 may be configured such that an MRT system noise-figure requirement is met, where the system noise-figure in the high-gain operating case may lie at values of less than 0.6 dB, for instance.

In order to adjust the bias current, the receive amplifier apparatus 26 is configured to operate the output amplifier unit 38 below a first switchover signal-level threshold value t2, which may lie at an input level of the MRT signal of −52 dBm, in a low-current mode. The receive amplifier apparatus 26 is further configured to operate the output amplifier 38 above the first switchover signal-level threshold value t2 in a high-current mode. For this purpose, the output amplifier unit 38 may receive a control signal 44 for changing the bias current of the output amplifier unit 38 (e.g., bias switch). The fact that in modern small-signal bipolar transistors a minimum noise figure is achieved at small collector currents may be exploited here. This means below the first switchover signal-level threshold value t2.

Above the first switchover signal-level threshold value t2, however, the output amplifier unit 38 is configured for maximum linear drive capability, in order that the receive amplifier apparatus 26 achieves the same maximum output power for the analog-to-digital converter 30 in both amplification settings. Therefore, the first switchover signal-level threshold value t2 is defined by a value of the MRT signal level that is smaller than the signal-level threshold value t1 by the ratio between the logarithmic gain values in the high-gain mode and low-gain mode. In other words, the gain value representing the amplification ratio is subtracted from the signal-level threshold value t1, which lies at −40 dBm, which gain value has a value of 12 dB in this example, thereby defining the first switchover signal-level threshold value t2 at −40 dBm−12 dB=−52 dBm. This means that for the graph g2, there is the same linear drive capability between t2 and t1 and then after the switchover to the low gain.

In addition, the receive amplifier apparatus 26 may be configured to operate the input amplifier unit 36 below a second switchover signal-level threshold value t3 in an input amplifier low-current mode, and above the second switchover signal-level threshold value t3 in an input amplifier high-current mode. For this purpose, the input amplifier unit 36 may receive a control signal 46 for changing the bias current of the input amplifier unit 36, which control signal switches the bias current and hence the operating point of the input amplifier unit 36 (e.g., bias switch).

The switchover of the input amplifier unit 36 may take place at a higher MRT signal level value than the switchover of the output amplifier unit 38 because there is no need to take into account any preceding change in amplification. Therefore the second switchover signal-level threshold value t3 may be configured at the same MRT signal level as the signal-level threshold value t1, in this example at −40 dBm. This additionally has the advantage that any changes in magnitude or phase of the cascaded amplification that may arise in the respective operating-point settings have to be performed only once for both threshold values t1 and t3 and once more for the first switchover signal-level threshold value t2.

Thus overall, under the stipulation that in the high-current mode and in the low-current mode the same linearity requirement is satisfied at the respective specified full-drive levels of the analog-to-digital converter 30, (e.g., at −28 dBm and at −40 dBm, respectively), the bias-current limiting may reduce the bias current in the low-current mode to a fraction of the original value. In the vast majority of the receive time, (e.g., in the edge regions of k-space), the receive amplifier apparatus 26 may thus be operated with reduced power dissipation.

The control signals 42, 44, 46 for changing the gain and/or for changing respective bias currents may be sent from the magnetic resonance tomography unit 12 to the local-coil apparatus 14, and in particular may be received wirelessly by the communication apparatus 32 in order to control the respective amplifier units 36, 38. Particularly, the communication apparatus 32 may include an optical sensor 48, which may be a photodiode, for example. Thus the optical sensor 48 may receive the respective control signals 42, 44, 46 by an optical signal. For this purpose, the magnetic resonance tomography unit 12 may have, for instance, a patient light 50, which is also called an in-bore light, which may send the control signals to the communication apparatus 32 by intensity modulation, e.g., in the radiofrequency range. This may achieve fast signal transfer for switching over the respective amplifier units 36, 38.

The magnetic resonance tomography unit 12 may also include a memory unit 52 configured to provide to a digital signal processing unit of the magnetic resonance tomography unit 12 at least one correction parameter for correcting a magnitude and a phase of the MRT signal resulting from the change to the gain and/or the change to the bias current, which digital signal processing unit may be implemented in the computing device 34 of the magnetic resonance tomography unit 12. The correction parameter may be determined by an experiment, for example, which is performed once as an act for commissioning the magnetic resonance tomography unit 12 and/or the local-coil apparatus 14. Alternatively, the correction parameter may also be determined and saved in the memory unit 52 during manufacture of the local-coil apparatus 14. Alternatively, or additionally, the memory unit 52 may also be provided directly in the local-coil apparatus 14.

Figure 3:
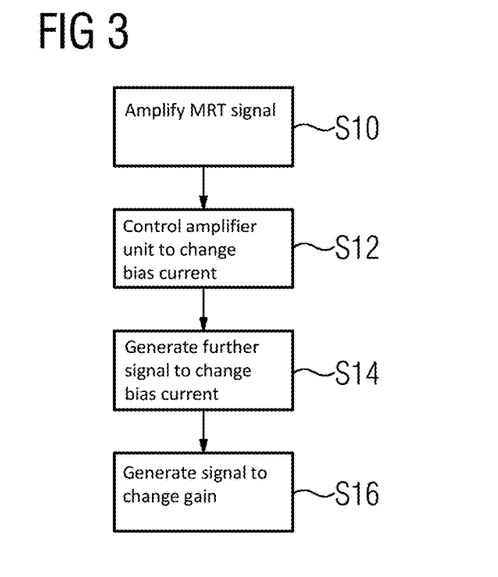
FIG. 3 depicts a block diagram of a method according to an embodiment.

FIG. 3 shows a method diagram for operating the local-coil apparatus 14 according to an exemplary embodiment. In act S10, an MRT signal level may have a low value, and an output amplifier unit 38 may amplify the MRT signal at a high gain. In addition, a bias current of the output amplifier unit 38 may be operated using a low-current mode, and a bias current of an input amplifier unit 36 in an input amplifier low-current mode.

When the MRT signal level reaches a first switchover signal-level threshold value t2, the output amplifier unit 38 may be controlled, in act S12, by a control signal 44 to change the bias current of the output amplifier unit 38 from the low-current mode to a high-current mode.

In act S14, when a second switchover signal-level threshold value t3 is reached, a further control signal 46 for changing the bias current of the input amplifier unit 36 from the input amplifier low-current mode to an input amplifier high-current mode may be generated in order to control the input amplifier unit 36.

Subsequent to, or simultaneous with, act S14, in act S16, the MRT signal level may reach a signal-level threshold value t1, in which case a control signal 42 for changing the gain from a high gain to a low gain is then generated, which control signal 42 is used to control the output amplifier unit 38.

The method described here may also exist in the form of a computer program or a computer program product, which implements the method inside a computing device 34 of a magnetic resonance tomography unit 12. There may also be an electronically readable data storage medium including electronically readable control data stored thereon, which data includes at least one described computer program product and is configured such that it performs a described method when the data storage medium is used in particular in an, or in the, electronic computing unit 34 of a magnetic resonance tomography unit 12.

One aspect of another exemplary embodiment is that of implementing a full signal dynamic range at 1.5 Tesla and 3 Tesla only by switching a receive-path cascaded amplification (e.g., receive amplifier apparatus 26) over in two or more stages (e.g., three or more). This is done by using a high-gain stage having more amplification and a lower total noise figure of the receive amplifier apparatus 26 for a certain part of k-space to be sampled, and using a low-gain stage having less amplification and a slightly higher noise figure for a central region of k-space. These gain stages may be part of an analog receive amplifier apparatus 26 before sampling by an analog-to-digital converter 30. The gain switchover, however, has no significant impact on a dissipated power.

Therefore, in addition to the gain switchover, the bias current or operating point (bias) of individual amplifier circuits (e.g., input amplifier unit 36 and output amplifier unit 38) is also switched according to the expected MRT signal level. In a high-current mode (e.g. high bias), the output amplifier unit 38 is configured for maximum linear drive capability, whereas in a low-current mode (e.g., low bias) it is configured for a minimum noise figure. The fact that in modern small-signal bipolar transistors the lowest noise figure is produced at small collector currents may be exploited here.

A switching signal "gain switch" 42 may reduce the cascaded amplification by ΔG (logarithmic ratio of the amplifications). A switchover of the cascaded amplification takes place when the expected MRT signal level reaches a defined threshold level (e.g., signal-level threshold value t1). This lies at least ΔG below a specified maximum level of the analog-to-digital converter 30 at which the receive system (e.g., local-coil apparatus 14) is still working with sufficient linearity in low-gain mode. The switchover of the operating point of the input amplifier unit 36 (e.g., low noise amplifier, LNA) by a control signal "bias switch" 46 may take place at the same time as the switchover of the cascaded amplification.

Because the switchable amplifier stage (e.g., output amplifier unit 38) is meant to supply the same maximum output power in both gain modes, its switchover by a control signal "bias switch" 44 is performed back at a first switchover signal-level threshold value t2 (first switchover signal-level threshold value t2=signal-level threshold value t1−ΔG).

A magnitude and phase of the cascaded amplification may have different values in the various operating-point settings. These differences may be corrected in a downstream digital signal processing unit. A correction parameter used for this purpose may be determined in an MRT experiment, which may be performed as a tune-up act once during commissioning by service personnel. Alternatively, correction parameters may be determined during local-coil manufacture and saved in the system.

Under the stipulation that in both bias modes the same linearity requirement is satisfied at the respective specified full-drive levels, for instance specified by the two-tone third-order intermodulation ratio, then in the case of a current-limited amplifier, the bias current in low-bias mode may be reduced to the fraction $10^{(-\Delta P\_max/20)}=0.25$ of the original value. In the vast majority of the receive time, the amplifiers may thus be operated with a power dissipation that is reduced to a quarter of the original value (e.g., low bias).

For wireless local coils, the switchover of the gain and bias may be controlled, for example, by a dedicated radio return channel (e.g., bidirectional radio link), by a light signal, for instance an infrared light signal or modulation of an in-bore light (e.g., by intensity modulation), by modulating a wirelessly transmitted reference signal (e.g., reference clock for sampling and/or digital signal processing for synthesizers that are used) or by modulating a signal for wireless energy transmission.

Overall, it is immaterial whether the received MRT signals are digitized at the local-coil apparatus 14 and transmitted digitally or whether they are transmitted directly in analog form and not digitized until in the magnetic resonance tomography unit 12. It is also immaterial whether or not frequency conversion takes place during analog signal processing.

In addition, an area of use for the local-coil apparatus 14 is not limited to a wireless local coil. For instance, even in a cable-connected local coil, the noise figure may be reduced at a low drive level, and, in particular in especially lightweight "blanket coils", it is possible to reduce the power loss and hence bothersome heating.

Overall, the local-coil apparatus 14 described here provides a significant reduction in power dissipation of the analog electronics and a reduction in the system noise figure.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local-coil apparatus for a magnetic resonance tomography (MRT) unit, the local-coil apparatus comprising:
   at least one receive coil configured to receive an MRT signal; and
   a receive amplifier apparatus comprising at least one output amplifier unit,
   wherein the receive amplifier apparatus is configured to amplify the MRT signal in order to drive an analog-to-digital converter (ADC),
   wherein the at least one output amplifier unit is configured to amplify the MRT signal below a signal-level threshold value by a high gain,
   wherein the at least one output amplifier unit is configured to amplify the MRT signal above the signal-level threshold value by a low gain, and
   wherein the receive amplifier apparatus is configured to change a bias current of the at least one output amplifier unit according to a defined MRT signal level.

2. The local-coil apparatus of claim 1, wherein the receive amplifier apparatus is configured to operate the at least one output amplifier unit below a first switchover signal-level threshold value of the MRT signal in a low-current mode,
   wherein the receive amplifier apparatus is configured to operate the at least one output amplifier unit above the first switchover signal-level threshold value in a high-current mode, and
   wherein the first switchover signal-level threshold value is smaller than the signal-level threshold value.

3. The local-coil apparatus of claim 2, wherein the local-coil apparatus comprises the ADC,
   wherein the signal-level threshold value is defined by a maximum input level value of the ADC at the high gain,
   wherein the first switchover signal-level threshold value is defined by a value of the MRT signal level that is smaller than the signal-level threshold value by a gain value, and
   wherein the gain value is an amplification ratio between the high gain and the low gain.

4. The local-coil apparatus of claim 3, wherein the receive amplifier apparatus further comprises an input amplifier unit, wherein the at least one output amplifier unit is connected after the input amplifier unit,
wherein the receive amplifier apparatus is configured to operate the input amplifier unit below a second switchover signal-level threshold value in an input amplifier low-current mode, and
wherein the receive amplifier apparatus is configured to operate the input amplifier unit above the second switchover signal-level threshold value in an input amplifier high-current mode.

5. The local-coil apparatus of claim 4, wherein the second switchover signal-level threshold value is the signal-level threshold value.

6. The local-coil apparatus of claim 1, wherein the receive amplifier apparatus further comprises an input amplifier unit,
wherein the at least one output amplifier unit is connected after the input amplifier unit,
wherein the receive amplifier apparatus is configured to operate the input amplifier unit below a second switchover signal-level threshold value in an input amplifier low-current mode, and
wherein the receive amplifier apparatus is configured to operate the input amplifier unit above the second switchover signal-level threshold value in an input amplifier high-current mode.

7. The local-coil apparatus of claim 6, wherein the second switchover signal-level threshold value is the signal-level threshold value.

8. The local-coil apparatus of claim 1, further comprising:
a wireless power supply.

9. The local-coil apparatus of claim 8, wherein the wireless power supply is a rechargeable battery, an induction coil, or a combination thereof.

10. The local-coil apparatus of claim 8, further comprising:
a communication apparatus configured to receive wirelessly one or more control signals for changing a gain and/or for changing the bias current.

11. The local-coil apparatus of claim 10, wherein the communication apparatus comprises an optical sensor configured to receive the respective control signals as an optical signal.

12. The local-coil apparatus of claim 1, further comprising:
a communication apparatus configured to receive wirelessly one or more control signals for changing a gain and/or for changing the bias current.

13. The local-coil apparatus of claim 12, wherein the communication apparatus comprises an optical sensor configured to receive the respective control signals as an optical signal.

14. The local-coil apparatus of claim 1, wherein the bias current is configured to be changed in order to reduce power dissipation of the receive amplifier apparatus.

15. The local-coil apparatus of claim 14, wherein the power dissipation is reduced while the receive amplifier apparatus is still configured to provide a full signal-level dynamic range of the MRT signal for driving the ADC.

16. The local-coil apparatus of claim 1, wherein the bias current is configured to be changed from a low-current mode to a high-current mode at a first switchover signal-level threshold value.

17. The local-coil apparatus of claim 16, wherein, upon switching the bias current from the low-current mode to the high-current mode at the first switchover signal-level threshold value, the at least one output amplifier unit is configured to be operated up to a maximum input level value of the ADC both at the low gain and the high gain.

18. A system comprising:
a magnetic resonance tomography (MRT) unit; and
a local-coil apparatus comprising:
at least one receive coil configured to receive an MRT signal; and
a receive amplifier apparatus comprising at least one output amplifier unit,
wherein the receive amplifier apparatus is configured to amplify the MRT signal in order to drive an analog-to-digital converter (ADC),
wherein the at least one output amplifier unit is configured to amplify the MRT signal below a signal-level threshold value by a high gain,
wherein the at least one output amplifier unit is configured to amplify the MRT signal above the signal-level threshold value by a low gain, and
wherein the receive amplifier apparatus is configured to change a bias current of the at least one output amplifier unit according to a defined MRT signal level;
wherein the MRT unit and/or the local-coil apparatus have a memory unit configured to provide to a digital signal processing unit of the MRT unit at least one correction parameter for correcting a magnitude and phase of the MRT signal resulting from a change to a gain and/or the change to the bias current.

19. A method for operating a local-coil apparatus, the method comprising:
receiving a magnetic resonance tomography (MRT) signal by at least one receive coil of the local-coil apparatus;
amplifying the MRT signal by a receive amplifier apparatus of the local-coil apparatus in order to drive an analog-to-digital converter (ADC), wherein at least one output amplifier unit of the receive amplifier apparatus amplifies the MRT signal below a signal-level threshold value by a high gain and amplifies the MRT signal above the signal-level threshold value by a low gain; and
controlling, by a control signal, the at least one output amplifier unit of the receive amplifier apparatus in order to change a gain, and wherein a bias current of the at least one output amplifier unit is changed by the control signal or one or more additional control signals, and wherein respective control signals are generated according to a defined MRT signal level.

* * * * *